US006594297B1

(12) United States Patent  
Hayakawa

(10) Patent No.: US 6,594,297 B1  
(45) Date of Patent: Jul. 15, 2003

(54) LASER APPARATUS IN WHICH SURFACE-EMITTING SEMICONDUCTOR IS EXCITED WITH SEMICONDUCT LASER ELEMENT AND HIGH-ORDER OSCILLATION MODES ARE SUPPRESSED

(75) Inventor: Toshiro Hayakawa, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 128 days.

(21) Appl. No.: 09/659,847

(22) Filed: Sep. 11, 2000

(30) Foreign Application Priority Data

Sep. 10, 1999 (JP) ............................................. 11-257531

(51) Int. Cl.$^7$ ........................... H01S 5/00; H01S 3/091; H01S 3/08
(52) U.S. Cl. .............................. 372/46; 372/75; 372/96; 372/99
(58) Field of Search ............................. 372/75, 21, 43, 372/20, 96, 92, 98, 99, 106, 46

(56) References Cited

U.S. PATENT DOCUMENTS 5,436,920 A * 7/1995 Minemoto et al. ............. 372/21
5,461,637 A 10/1995 Mooradian et al. ........... 372/92
5,627,853 A 5/1997 Mooradian et al. ........... 372/92

FOREIGN PATENT DOCUMENTS

WO WO 00/10234 2/2000

OTHER PUBLICATIONS

Botez, *Diode Laser Arrays*, Cambridge University Press, pp. 1–11, 22–27, 62–67. (No month) 1994.
Someya et al, "Room Temperature Operation of Blue InGaN VCSELs by Optical Pumping", The Blue Laser Diode, Springer, Berlin, 1997 (No month available) pp. CPDIS–1–CPDIS–2.

Nakamura et al, "InGaN/GaN/AlGaN–Based Laser Diodes Grown on GaN Substrates witha Fundamental Transverse Mode", Jpn J. Appl Phys. vol. 37 (1998) pp. L1020–L1022, Part 2, No. 9A/B, Sep. 15, 1998 pp. L1020–L1022.

Pezeshki, et al, "400–mW Single–Frequency 660–nm Semiconductor Laser", IEEE Photonics Technology Letters, vol. 11, No. 7, Jul. 1999 pp. 791–796.

Kuznetsov, et al, "Design and Characteristics of HighPower (>0.5–WCW) Diode–Pumped Vertical–ExternalCavity Surface–Emitting Semiconductor Lasers with Circular TEM$_{00}$ Beams", IEEE Journal of Selected Topics in Quantum Electronics, vol. 5, No. 3, May/Jun. 1999 pp. 561–573.

Kuznetsov et al., "Design and Characteristics of HighPower (>0.5–W CW) Diode–Pumped Vertical–ExternalCavity Surface–Emitting Semiconductor Lasers with Circular TEM$_{00}$ Beams," *IEEE Journal of Selected Topics in Quantum Electionics*, vol. 5, No. 3, (May/Jun. 1999), pp. 561–573.

(List continued on next page.)

*Primary Examiner*—Quyen Leung
(74) *Attorney, Agent, or Firm*—Sughrue Mion, PLLC

(57) ABSTRACT

A laser apparatus includes a semiconductor laser element, a surface-emitting semiconductor element including a first mirror, and a second mirror. The semiconductor laser element emits first laser light having a first wavelength. The surface-emitting semiconductor element is excited with the first laser light, and emits second laser light having a second wavelength which is longer than the first wavelength. The first mirror in the surface-emitting semiconductor element is arranged on one side of the first active layer. The second mirror is arranged outside the surface-emitting semiconductor element so that the first and second mirrors form a resonator in which the second laser light resonates. The surface-emitting semiconductor element includes a structure for controlling a spatial mode of the second laser light.

24 Claims, 12 Drawing Sheets

OTHER PUBLICATIONS

Kuznetsov, et al., "High–Power (>0.5–W CW) Diode–Pumped Vertical External–Cavity Surface–Emitting Semiconductor Lasers with Circular $TEM_{00}$ Beams," *IEEE Photonics Technology Letters*, vol. 9, No. 8, (Aug. 1997), pp. 1063–1065.

Vakhshoori et al., 2mW CW singlemode operation of a tunable 1550nm vertical cavity surface emitting laser with 50 nm tuning range, *Electronics Letters*, vol. 35, No. 11, (May 27, 1999), pp. 900–901.

Demeulenaere et al., "Detailed Study of A1As–Oxidized Apertures in VCSEL Cavities for Optimized Modal Performance," *IEEE Journal of Quantum Electronics*, vol. 35, No. 3, Mar. 1999), pp. 358–367; and.

Kenichi IGA, "Surface Emitting Lasers," *Electronics and Communications in Japan*, Part 2, vol. 82, No. 19, (1999), pp. 70–82. (No month available).

* cited by examiner

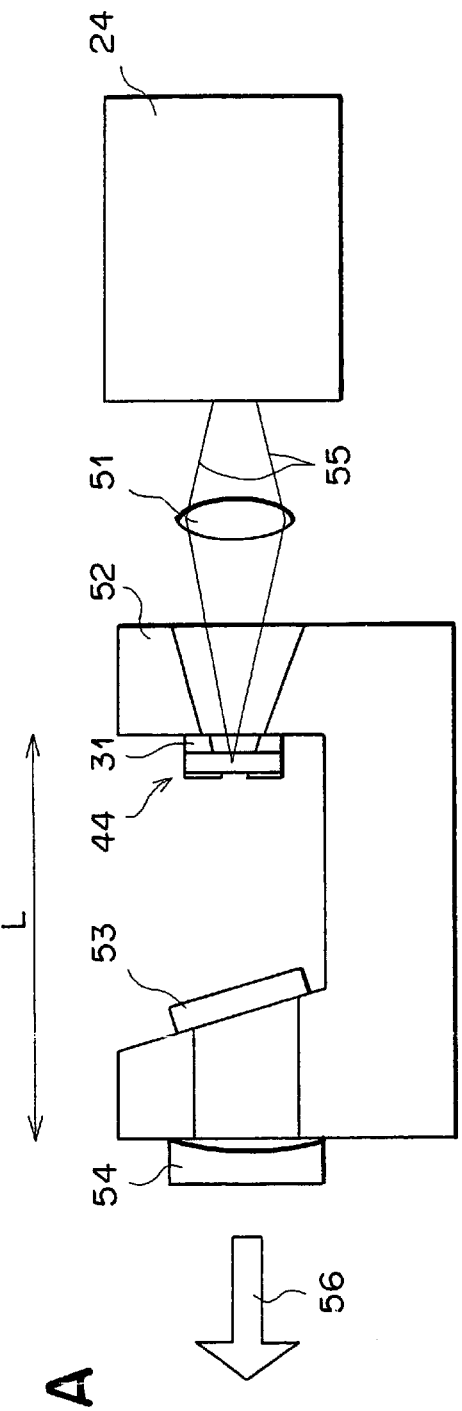
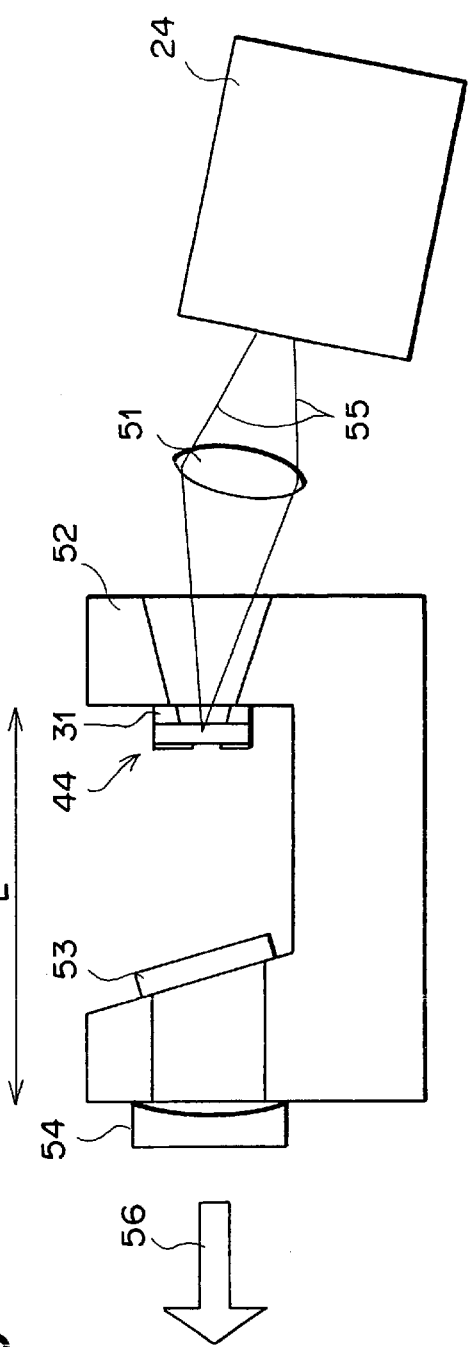
FIG. 3A
FIG. 3B

LASER APPARATUS IN WHICH SURFACE-EMITTING SEMICONDUCTOR IS EXCITED WITH SEMICONDUCT LASER ELEMENT AND HIGH-ORDER OSCILLATION MODES ARE SUPPRESSED

BACKGROUND OF THE INVENTION

1. Field of the Invention

The present invention relates to a laser apparatus using a semiconductor laser element.

2. Description of the Related Art

Conventionally, narrow-stripe single-transverse-mode semiconductor laser devices, which emit high quality laser beams, have a drawback that the practical output power is at most about 200 to 300 mW. There are two causes for this drawback. The first cause is so-called spatial hole burning. That is, since the rate of carrier supply for generating laser light is limited by the carrier diffusion process when the output power is high, carrier density decreases in a region where the laser beam intensity is high. Due to spatial hole burning, the refractive index of the semiconductor medium increases, and the waveguide mode is affected by the increase in the refractive index. Thus, the quality of the laser beams deteriorates, and kinks are produced in the current-light output characteristics. The second cause for the above drawback is the great optical output density. For example, in the case where the stripe width is 4 $\mu$m, and the equivalent beam diameter in the direction perpendicular to the junction is 0.5 mm, the optical output density reaches 15 MW/cm$^2$ when the output power is 300 mW. Therefore, heavy load is imposed on the semiconductor medium, and various characteristics of the semiconductor laser device deteriorate. Thus, it is difficult to obtain a reliable narrow-stripe single-transverse-mode semiconductor laser device which emits laser light with high output power.

In order to remove the above first cause, attempts have been made to optimize waveguide structure. In addition, in order to remove the above second cause, protection coating at end surfaces has been optimized, and window structures at end surfaces have been developed. However, these techniques are approaching their limits. Therefore, in order to realize a narrow-stripe single-transverse-mode semiconductor laser device which emits laser light with high output power, it is necessary to develop a new mode control technique, and reduce the optical density by increasing the light emission area.

Various attempts have been made to realize a semiconductor laser device which emits spatially coherent laser light, and has output power of hundreds of watts or more. For example, Botez and Schifres, "Diode Laser Arrays," Cambridge Press, 1994 discloses a monolithic structure realizing a high quality laser beam, and a process for producing the structure. However, the structure and process are complicated.

In order to remedy the drawbacks of the conventional current-injection type semiconductor laser devices, U.S. Pat. Nos. 5,461,637 and 5,627,853 propose surface-emitting semiconductor laser devices which are excited with light. However, since these semiconductor laser devices utilize the thermal lens effect, i.e., the effect of increasing refractive indexes with temperature, the temperature must be raised. In addition, the above semiconductor laser devices are sensitive to temperature distribution, and the spatial oscillation mode is unstable. The spatial mode becomes further unstable when output power is high, since a cavity is generated in a carrier distribution due to generation of laser light having high output power (i.e., spatial hole burning occurs), and refractive indexes decrease with increase in the number of carriers due to the so-called plasma effect.

In addition, Nakamura et al., "InGaN/GaN/AlGaN-Based Laser Diodes Grown on GaAs substrates with a Fundamental Transverse Mode", Japanese Journal of Applied Physics Part 2 Letters, vol. 37, 1998, pp. L1020 discloses an InGaN-based short-wavelength semiconductor laser device. However, in this semiconductor laser device, it is difficult to emit laser light with high output power in a single transverse mode.

Further, B. Pezeshki et al., "400-mW Single-Frequency 660-nm Semiconductor Laser," IEEE Photonics technology Letters, vol. 11, pp. 791, 1999 discloses an AlGaInP red semiconductor laser device. However, higher quality and higher output power are also required in this semiconductor laser device.

As described above, it is very difficult to achieve a single transverse mode oscillation with high output power in the conventional semiconductor laser devices.

On the other hand, in the conventional semiconductor-laser excited solid-state laser apparatuses, it is difficult to achieve high speed modulation of laser light by directly modulating semiconductor laser elements which are provided as excitation light sources since the lifetimes of fluorescence emitted from rare earth elements which constitute solid-state laser crystals are very long.

SUMMARY OF THE INVENTION

An object of the present invention is to provide a reliable laser apparatus which uses a semiconductor laser element, oscillates in a fundamental mode with high output power, and enables high speed modulation of output laser light.

According to the present invention, there is provided a laser apparatus comprising: a semiconductor laser element which emits first laser light having a first wavelength; a surface-emitting semiconductor element which is excited with said first laser light, emits second laser light having a second wavelength which is longer than said first wavelength, and has a first active layer and a first mirror arranged on one side of the first active layer; and a second mirror arranged outside the surface-emitting semiconductor element so that the first and second mirrors form a resonator in which the second laser light resonates. The surface-emitting semiconductor element includes a structure for controlling a spatial mode of the second laser light.

Since the output of the laser apparatus according to the present invention is obtained from the surface-emitting semiconductor element which is excited with laser light emitted from a semiconductor laser element, and the structure for controlling a spatial mode of the second laser light semiconductor laser element is provided, instability of the spatial mode due to the thermal lens effect or the plasma effect can be effectively suppressed. Therefore, it is possible to stably maintain a fundamental transverse mode in a wide output range from low power to high power (in particular, in the high output power region), and obtain high-quality laser light in the fundamental transverse mode.

Preferably, the laser apparatuses according to the present invention may also have one or any possible combination of the following additional features (i) to (xii).

(i) The above structure may have a size which is 0.1 to 10 times as large as a diameter to which the second laser light spreads at a position of the structure for controlling the spatial mode of the second laser light. In this case, the characteristics and beam shape of the output of the laser apparatus are particularly improved.

(ii) The structure may be realized by a pinhole spatial filter being arranged at a light exit end surface of the surface-emitting semiconductor element, having a pinhole, and allowing passage of the second laser light emitted by the surface-emitting semiconductor element, through only the pinhole. In this case, it is possible to increase resonator loss in high-order modes than that in the fundamental mode. Therefore, the oscillation in the high-order modes can be effectively suppressed, and resultantly oscillation in the fundamental transverse mode is realized.

(iii) In the above feature (ii), the pinhole may have a size which is 0.1 to 10 times as large as a diameter to which the second laser light spreads at a position of the structure.

(iv) The second mirror may have a limited area, be arranged in parallel with a light exit end surface of the surface-emitting semiconductor element, and realize the above structure for controlling the spatial mode of the second laser light. Since the laser light in the fundamental transverse mode can be selectively reflected by the second mirror, it is possible to increase resonator loss in high-order modes more than that in the fundamental mode. Therefore, the oscillation in the high-order modes can be effectively suppressed, and resultantly oscillation in the fundamental transverse mode is realized.

(v) In the above feature (iv), the mirror may have a size which is 0.1 to 10 times as large as a diameter to which the second laser light spreads at a position of the structure.

(vi) The first active layer may be formed in only a limited area in a plane parallel to a light exit end surface of the surface-emitting semiconductor element, and realize the structure for controlling the spatial mode of the second laser light.

(vii) In the above feature (vi), the limited area may have a size which is 0.1 to 10 times as large as a diameter to which the second laser light spreads at a position of the structure for controlling the spatial mode of the second laser light.

(viii) The laser apparatus according to the present invention may further comprise wavelength selection means arranged in the resonator.

(ix) The laser apparatus according to the present invention may further comprise polarization control means arranged in the resonator.

(x) The semiconductor laser element may have a second active layer made of an $In_{v1}Ga_{1-v1}N$ material, and the first active layer may be made of an $In_{v2}Ga_{1-v2}N$ material, where $0<v1<v2<1$.

(xi) The semiconductor laser element may have a second active layer made of an InGaN material, and the first active layer may be made of an AlGaInP or GaInP material.

(xii) The semiconductor laser element may have a second active layer made of an $In_{w1}Ga_{1-w1}As$ material, and the first active layer may be made of an $In_{w2}Ga_{1-w2}As$ material, where $0<w1<w2<1$.

In the above items (x) to (xii), "a XY material" means a material which contains at least the elements X and Y when each of X and Y is a symbol of an element.

DESCRIPTION OF THE DRAWINGS

FIG. 3A is a diagram illustrating the construction of the laser apparatus as the first embodiment of the present invention.

FIG. 3B is a diagram illustrating the construction of the laser apparatus as a variation of the first embodiment of the present invention.

DESCRIPTION OF PREFERRED EMBODIMENTS

Embodiments of the present invention are explained in detail below with reference to drawings.

First Embodiment

Figure 1:
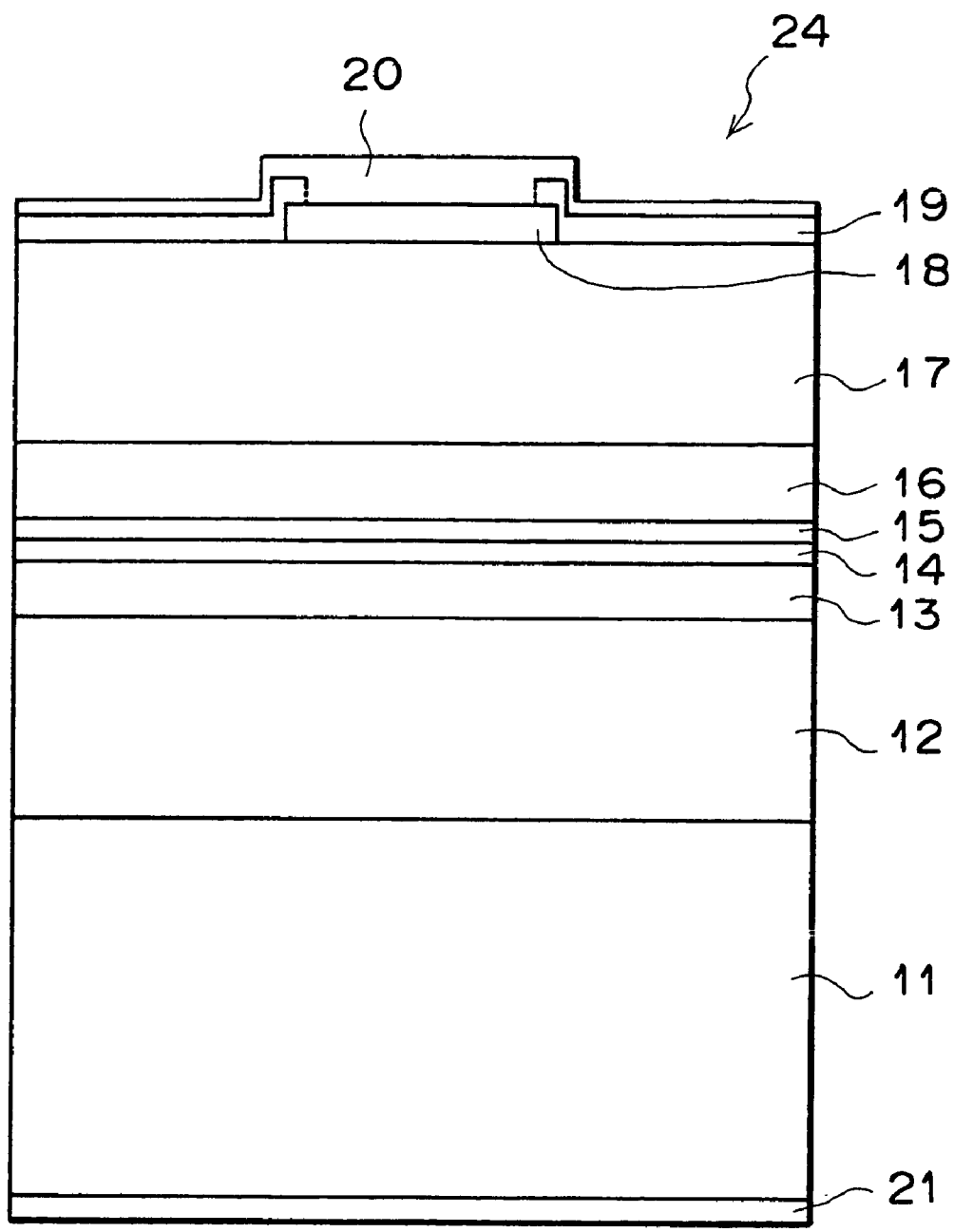
FIG. 1 is a crosssectional view of a semiconductor laser element which is used as an excitation light source in a laser apparatus as the first embodiment of the present invention.

The semiconductor laser element which emits laser light in the 810 nm band is used as an excitation light source in the first embodiment. FIG. 1 is a crosssectional view of the semiconductor laser. The semiconductor laser element used as the excitation light source in the first embodiment is produced as follows.

Initially, an n-type GaAs buffer layer 12, an n-type $Al_{0.63}Ga_{0.37}As$ cladding layer 13, an n-type or i-type (intrinsic) InGaP optical waveguide layer 14, an InGaAsP single-quantum-well active layer 15, a p-type or i-type InGaP optical waveguide layer 16, a p-type $Al_{0.63}Ga_{0.37}As$ cladding layer 17, a p-type GaAs cap layer 18 are formed on an n-type GaAs (001) substrate 11 by organometallic vapor phase epitaxy. Thereafter, areas of the p-type GaAs cap layer 18 other than a stripe area having a width of 100 μm and corresponding to an oscillation stripe are removed by etching using an ammonia etchant, and then a $SiO_2$ insulation film 19 is formed. Next, a stripe area of the $SiO_2$ insulation film 19 located on the above stripe area of the p-type GaAs cap layer 18 is removed, and then a p electrode 20 is formed over the layered structure formed as above. Thereafter, the substrate 11 is polished, and an n electrode 21 is formed on the polished surface of the substrate 11. Finally, a resonator is formed by cleavage, and a high reflectance coating and a low reflectance coating are provided on the respective end surfaces so as to form a resonator. The construction of FIG. 1 is then formed into a chip.

Figure 2A:
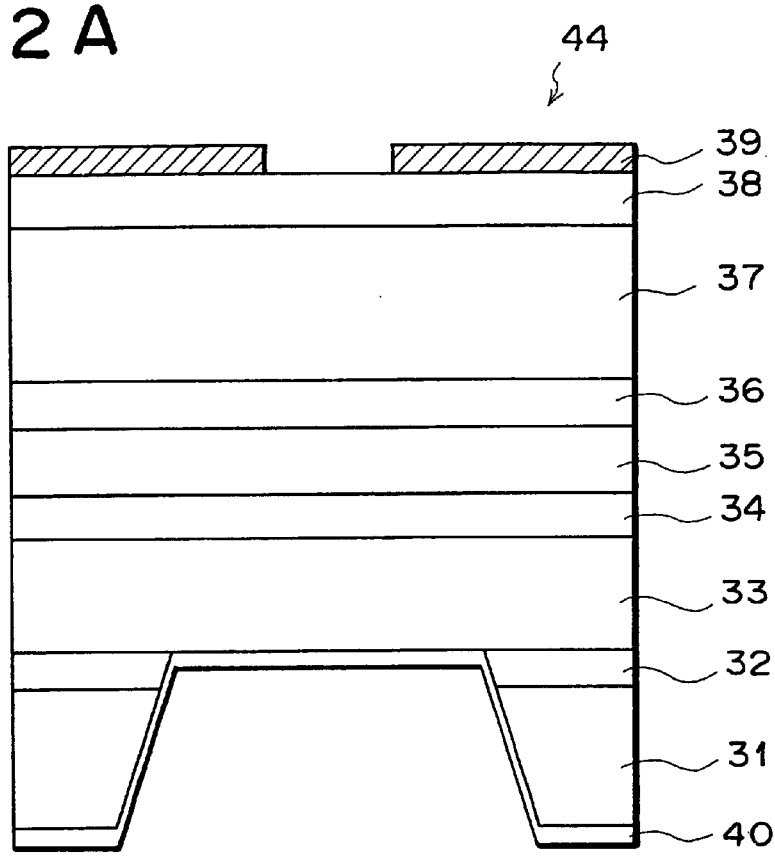
FIG. 2A is a crosssectional view of a surface-emitting semiconductor element which is also used in the laser apparatus as the first embodiment of the present invention.
Figure 2B:
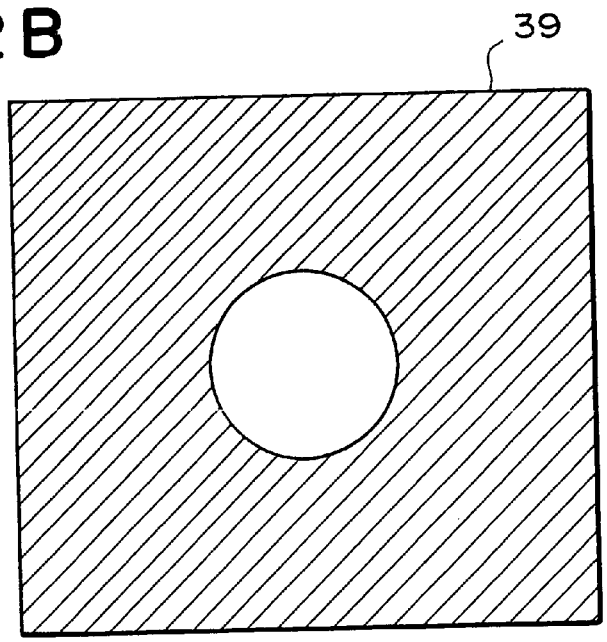
FIG. 2B is a top view of a surface-emitting semiconductor element which is also used in the laser apparatus as the first embodiment of the present invention.

FIGS. 2A and 2B are a crosssectional and top views of a surface-emitting semiconductor element which is also used in the laser apparatus as the first embodiment of the present invention. The surface-emitting semiconductor element illustrated in FIGS. 2A and 2B is excited with excitation laser light emitted from the semiconductor laser element 24 of FIG. 1, and oscillates in a single transverse mode. The surface-emitting semiconductor element used in the first embodiment is produced as follows.

Initially, a GaAs buffer layer 32, a $GaAs/Al_{0.7}Ga_{0.3}As$ multilayer optical filter (Bragg reflection mirror) 33, a GaAs optical confinement layer 34, a $GaAs/In_{0.2}Ga_{0.8}As$ multiple-quantum-well active layer 35, a GaAs optical confinement layer 36, and a $Al_{0.7}Ga_{0.3}As$ carrier confinement layer 37 are formed on a GaAs (001) substrate 31 by organometallic vapor phase epitaxy. Next, a $SiO_2$ antireflection film 38 is formed on the $Al_{0.7}Ga_{0.3}As$ carrier confinement layer 37, by electron beam evaporation or the like. Then, a Ti film 39 having a pinhole of a diameter of 0.4 mm at its center is formed on the $SiO_2$ antireflection film 38 as illustrated in FIG. 2B by a liftoff method using electron beam evaporation and photoresist patterning. Thereafter, the GaAs substrate 31 is polished, and regions of the GaAs substrate 31 and the GaAs buffer layer 32 which are broader than an oscillation region of the surface-emitting semiconductor element are removed by selective etching so that a hollow which facilitates passage of excitation laser light is formed. Next, a $SiO_2$ film 40 is formed so as to cover the inner surface of the hollow, where the $SiO_2$ film 40 functions as an antireflection film for the excitation laser light having the wavelength of 810 nm. Finally, the layered structure formed as above is cleaved, and is further formed into a chip.

The above $GaAs/Al_{0.7}Ga_{0.3}As$ multilayer optical filter (Bragg reflection mirror) 33 is designed to have a high reflectance of 90% or more at the oscillation wavelength of 980 nm and a low reflectance of 5% or less at the wavelength of 810 nm, which is the wavelength of the excitation laser light. For example, the multilayer optical filter 33 may include about twenty pairs of GaAs and $Al_{0.7}Ga_{0.3}As$ layers each having a thickness corresponding to one-quarter of a wavelength which is longer than the oscillation wavelength.

FIG. 3A is a diagram illustrating the construction of the laser apparatus as the first embodiment of the present invention.

The laser apparatus of FIG. 3A comprises the semiconductor laser element 24 as the excitation light source, a heatsink 52 having openings, the surface-emitting semiconductor element 44 bonded to the heatsink 52 at the surface of the substrate 31, a concave mirror 54 as an output mirror, an external resonator(length of resonator: L) formed by a concave surface of the concave mirror 54 and the GaAs/$Al_{0.7}Ga_{0.3}As$ multilayer optical filter 33 of the surface-emitting semiconductor element 44, and a wavelength selection element 53 arranged in the external resonator 57. The GaAs/$Al_{0.7}Ga_{0.3}As$ multilayer optical filter 33 functions as a mirror.

In the construction of FIG. 3A, excitation laser light 55 emitted from the semiconductor laser element 24 is collected by the lens 51 into the semiconductor layers of the surface-emitting semiconductor element 44, is then efficiently absorbed in the optical confinement layers 34, 36 and the $GaAs/In_{0.2}Ga_{0.8}As$ multiple-quantum-well active layer 35, and excites the surface-emitting semiconductor element 44. Light emitted by the surface-emitting semiconductor element 44 resonates in the external resonator 57, and laser light 56 having the wavelength of about 980 nm is output through the output mirror 54.

Due to the provision of the heatsink 52, heat generated by the surface-emitting semiconductor element can be dissipated.

Alternatively, the incident direction of the excitation laser light 55 from the semiconductor laser element 24 may be inclined as illustrated in FIG. 3B so as to suppress light returned from the external resonator 57 to the semiconductor laser element 24.

According to a design of this embodiment, the beam diameter at the position of the pinhole spatial filter is 0.3 mm when the beam diameter is defined as a diameter of a beam spread within which the intensity of the beam is $1/e^2$ or more of the peak intensity. Further, in order to suppress laser light generated by oscillation in high-order modes, which spreads widely, the diameter of the pinhole formed in the Ti film is set to 0.4 mm. Although controllability of the spatial mode is improved with decrease in the diameter of the pinhole, the amount of laser light in the fundamental mode stopped by the Ti film also increases, i.e., the loss increases, when the pinhole is too small. Therefore, it is preferable that the diameter of the pinhole is 0.1 to 10 times the beam diameter.

The wavelength selection element 53 is arranged in the external resonator 57 in order to realize oscillation in a single longitudinal mode, and may be a Lyot filter or an etalon. Further, more than one Lyot filter or etalon may be arranged in the external resonator 57.

Furthermore, in order to control polarization, a Brewster plate may be arranged in the external resonator 57.

The laser apparatus as the first embodiment has the following advantages.

(a) In the laser apparatus of FIG. 3A or 3B, it is possible to achieve high speed modulation of the output laser light by directly modulating the semiconductor laser element 24, while high speed modulation is difficult in the conventional solid-state laser.

(b) Since the semiconductor laser element 24 can be a broad area type semiconductor laser element as described with reference to FIG. 1, the semiconductor laser element 24 can emit laser light with high output power (e.g., 1 to 10 watts). Therefore, the laser apparatuses of FIGS. 3A and 3B can emit laser light of hundreds of milliwatts to several watts. For example, the beam area in the broad area type semiconductor laser element is $(0.15 \text{ mm})^2 \times \pi = 70,650 \text{ μm}^2$, while the beam areas in the aforementioned narrow-stripe single-transverse-mode semiconductor laser devices are about 2 μm$^2$. That is, the beam area of the broad area type semiconductor laser element is $10^4$ times greater than beam areas of narrow-stripe single-transverse-mode semiconductor laser devices.

(c) The surface-emitting semiconductor element in the first embodiment is excited with light, and is therefore different from the usual semiconductor laser elements driven by current injection, in that the surface-emitting semiconductor element 44 is free from heat generation and decrease in efficiency due to increase in electrical resistance in multilayer semiconductor reflection mirrors or the like. Therefore, although the conventional surface-emitting semiconductor elements must have a complicated structure for reducing electrical resistance in multilayer semiconductor reflection mirrors or the like (for example, by local doping or arrangement of a layer having graded composition between layers constituting a multilayer optical filter), the surface-emitting semiconductor element excited with light does not require such a complicated structure, and thus can be produced easily.

(d) The surface-emitting semiconductor element excited with light is also different from the usual semiconductor laser elements driven by current injection, in that the surface-emitting semiconductor element excited with light is free from the aforementioned problem of deterioration with elapse of time due to short-circuit currents caused by diffusion of dopants such as magnesium. Thus, the lifetimes of the laser apparatuses of FIGS. 3A and 3B are long.

Second Embodiment

Figure 4:
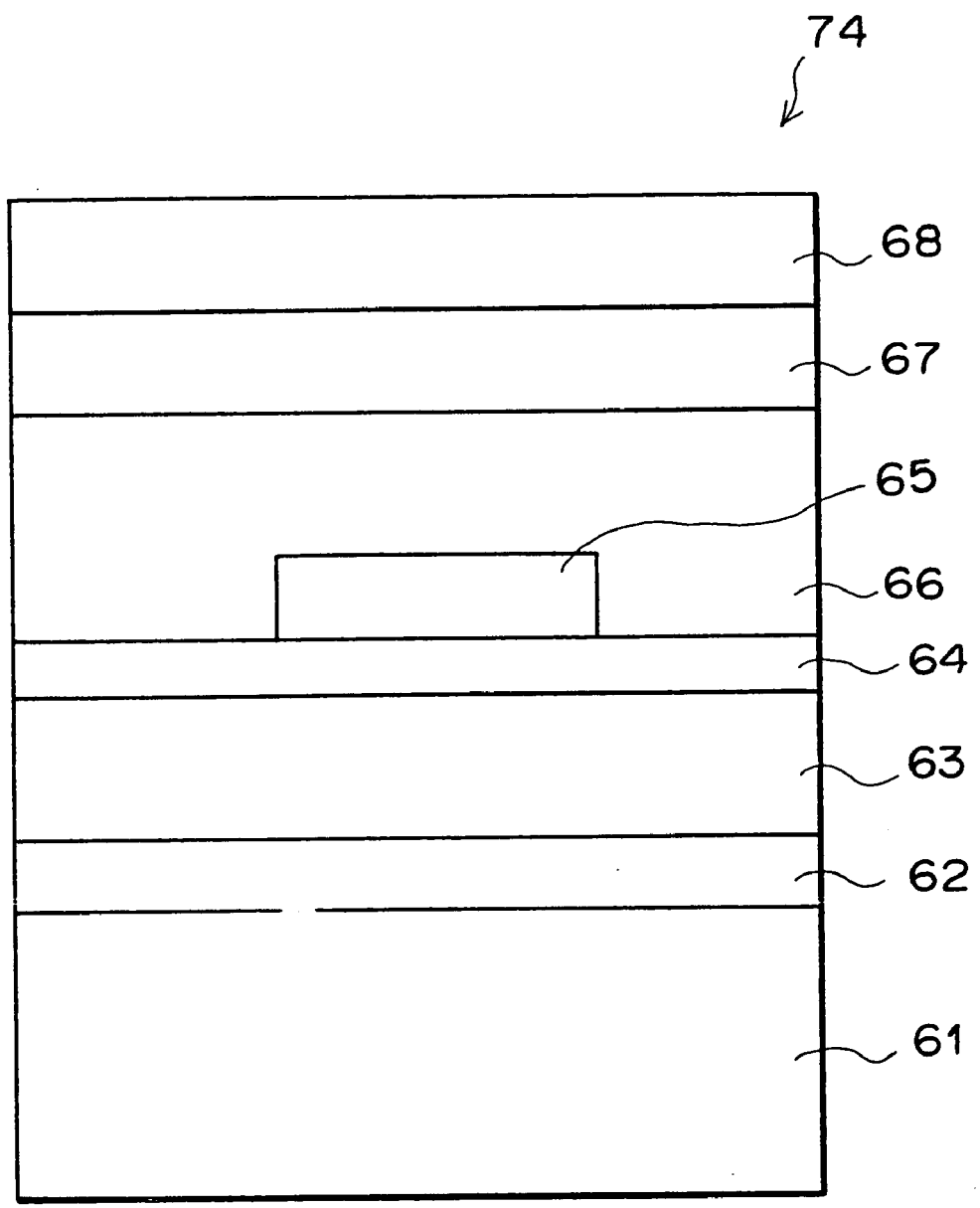
FIG. 4 is a crosssectional view of a surface-emitting semiconductor element which is used in the laser apparatus as the second embodiment of the present invention.

FIG. 4 is a crosssectional view of a surface-emitting semiconductor element which is used in the laser apparatus as the second embodiment of the present invention. The surface-emitting semiconductor element of FIG. 4 is excited with excitation laser light emitted from the semiconductor laser element 24 of FIG. 1, and oscillates at the wavelength of 980 nm. The surface-emitting semiconductor element used in the second embodiment is produced as follows.

Initially, a GaAs buffer layer 62, a Bragg reflection mirror 63, a GaAs optical confinement layer 64, and a GaAs/$In_{0.2}Ga_{0.8}As$ multiple-quantum-well active layer 65 are formed on a GaAs (001) substrate 61 in the first process of organometallic vapor phase epitaxy. The Bragg reflection mirror 63 is comprised of twenty pairs of GaAs and $Al_{0.7}Ga_{0.3}As$ layers, the GaAs layer in each pair has a thickness of $\lambda/4n_{GaAs}$, the $Al_{0.7}Ga_{0.3}As$ layer in each pair has a thickness of $\lambda/4n_{Al0.7Ga0.32As}$, $\lambda$ is an oscillation wavelength of the surface-emitting semiconductor element of FIG. 4, and $n_{GaAs}$ and $n_{Al0.7Ga0.3As}$ are the refractive indexes of GaAs and $Al_{0.7}Ga_{0.3}As$ at the oscillation wavelength $\lambda$, respectively. Next, the GaAs/$In_{0.2}Ga_{0.8}As$ multiple-quantum-well active layer 65 is chemically etched with a mixture of sulfuric acid, hydrogen peroxide, and water so that a cylindrical portion of the GaAs/$In_{0.2}Ga_{0.8}As$ multiple-quantum-well active layer 65 having a diameter of about 0.5 mm remains. This etching is performed through the entire thickness of the GaAs/$In_{0.2}Ga_{0.8}As$ multiple-quantum-well active layer 65, or to a depth of a portion of the thickness of the GaAs/$In_{0.2}Ga_{0.8}As$ multiple-quantum-well active layer 65. The etching may be performed to a depth of a portion of the thickness of the GaAs optical confinement layer 64. Thereafter, a GaAs optical confinement layer 66 and an $Al_{0.7}Ga_{0.3}As$ carrier confinement layer 67 are formed over the structure formed as above, in the second process of organometallic vapor phase epitaxy. Then, a $SiO_2$ antireflection film 68 having a thickness of $\lambda/4n_{SiO2}$ is formed on the $Al_{0.7}Ga_{0.3}As$ carrier confinement layer 67, by electron beam evaporation or the like, where $n_{SiO2}$ is the refractive index of $SiO_2$ at the oscillation wavelength $\lambda$. Finally, the rear surface of the GaAs substrate 61 is polished, and the construction of FIG. 4 is cleaved and formed into a chip. In contrast to the first embodiment, no portion of the GaAs substrate 61 and the GaAs buffer layer 62 is removed.

Figure 5:
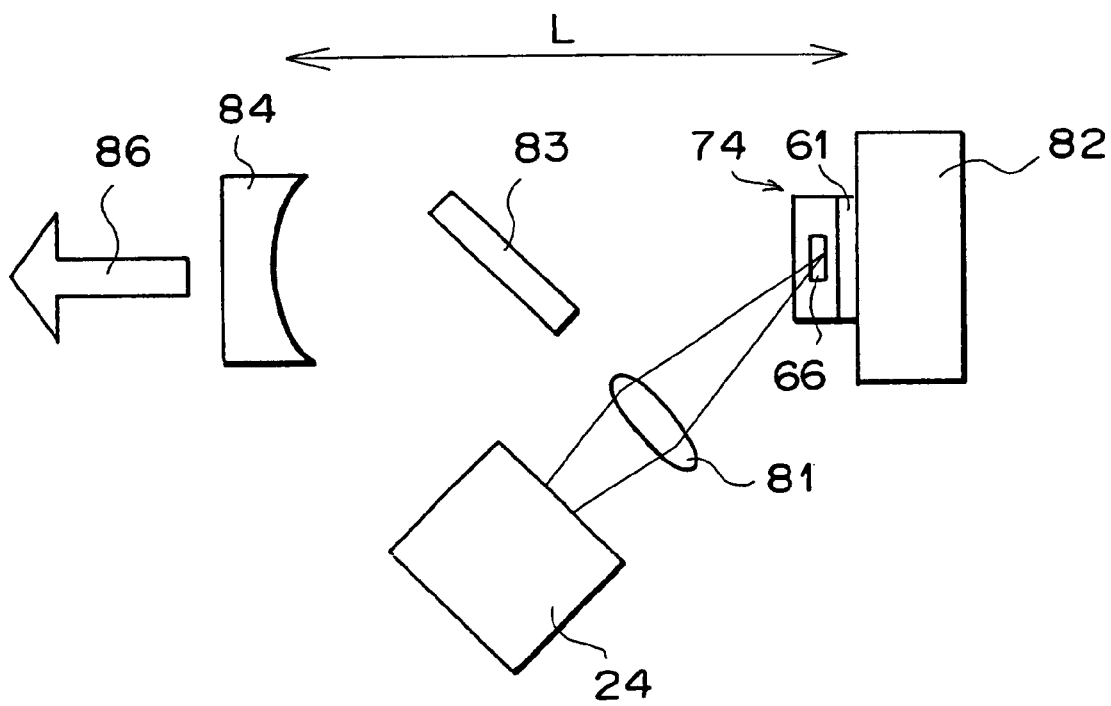
FIG. 5 is a diagram illustrating the construction of the laser apparatus as the second embodiment of the present invention.

FIG. 5 is a diagram illustrating the construction of the laser apparatus as the second embodiment of the present invention.

The laser apparatus of FIG. 5 comprises the semiconductor laser element 24 as the excitation light source, a heatsink 82, the surface-emitting semiconductor element 74 bonded to the heatsink 82 at the surface of the substrate 61, a concave mirror 84 as an output mirror, an external resonator 87 formed by a concave surface of the concave mirror 84 and the Bragg reflection mirror 63 of the surface-emitting semiconductor element 74, and a Brewster plate 83 arranged in the external resonator(length of resonator: L) for controlling polarization.

In the construction of FIG. 5, excitation laser light emitted from the semiconductor laser element 24 is collected by the lens 81 into the semiconductor layers of the surface-emitting semiconductor element 74, and excites the surface-emitting semiconductor element 74. Then, light emitted by the surface-emitting semiconductor element 74 resonates in the external resonator, and laser light 86 in the 980 nm band exits from the output mirror 84.

Since the forward side (opposite to the GaAs substrate 61) of the active layer of the surface-emitting semiconductor element 74 is not shielded from the excitation laser light, the surface-emitting semiconductor element 74 is excited from the forward side.

In addition, since the active layer is formed in a smaller area than the entire area of the surface-emitting semiconductor element 74, corresponding to a beam diameter, it is possible to suppress oscillation in high-order transverse modes, and realize stable oscillation in a fundamental transverse mode.

Further, since the entire surface of the substrate of the surface-emitting semiconductor element 74, i.e., the end surface of the surface-emitting semiconductor element 74 which is nearer to the active layer, is held by the heatsink 82, heat generated by the surface-emitting semiconductor element 74 can be effectively dissipated. Therefore, the arrangement of the heatsink 82 illustrated in FIG. 5 allows the surface-emitting semiconductor element 74 to output the laser light with high power.

Third Embodiment

Figure 6:
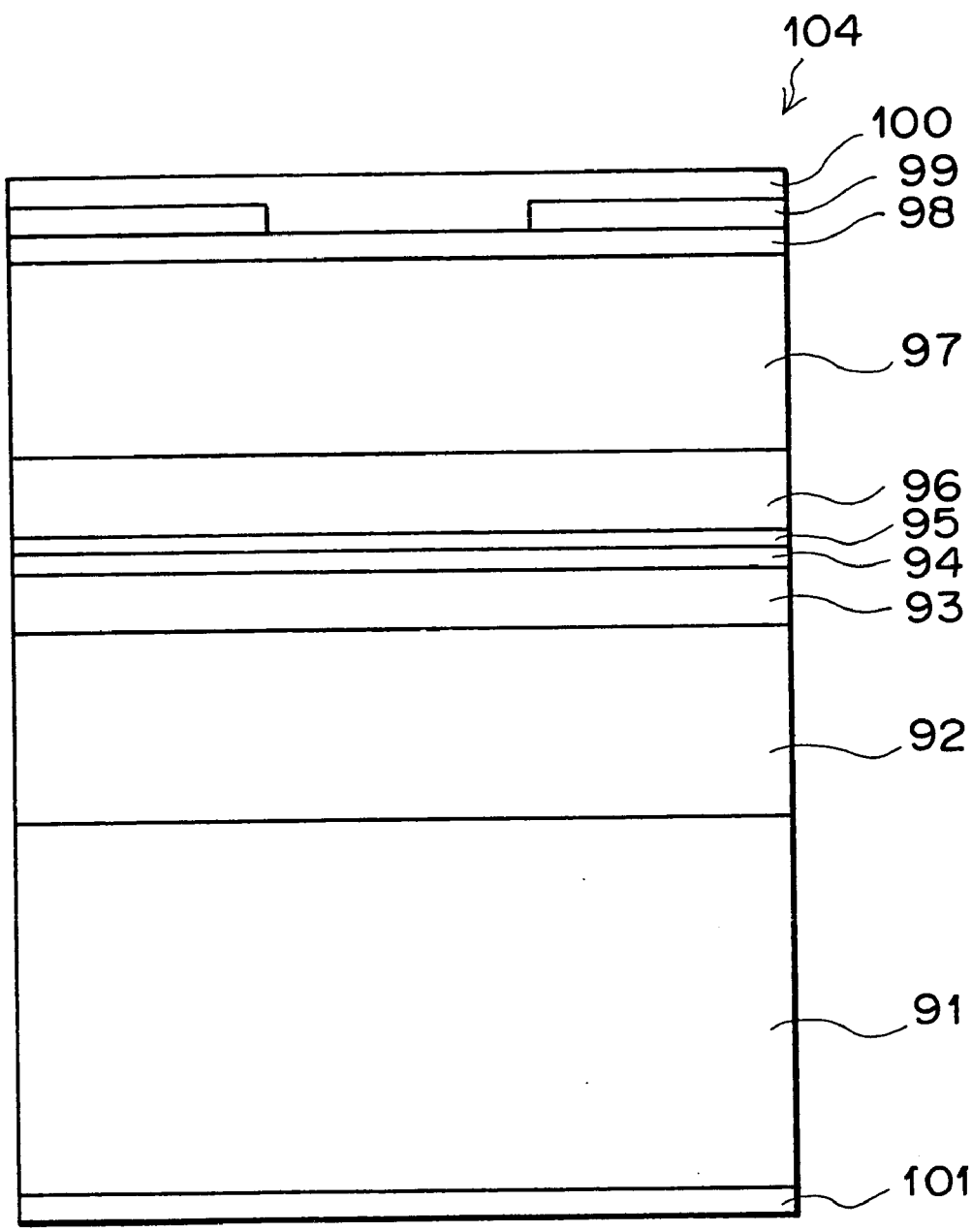
FIG. 6 is a crosssectional view of a semiconductor laser element which is used as an excitation light source in a laser apparatus as the third embodiment of the present invention.

The semiconductor laser element which emits laser light in the 370 nm band is used as an excitation light source in the third embodiment. FIG. 6 is a crosssectional view of the semiconductor laser. The semiconductor laser element used as the excitation light source in the third embodiment is produced as follows.

Initially, an n-type GaN (0001) substrate 91 is formed in accordance with the method disclosed by Nakamura et al., "InGaN/GaN/AlGaN-Based Laser Diodes Grown on GaAs Substrate with a Fundamental Transverse Mode", Japanese Journal of Applied Physics Part 2 Letters, vol. 37, 1998, pp. L1020. Then, an n-type $Ga_{1-z1}Al_{z1}N$/GaN superlattice cladding layer 92 (0<z1<1), an n-type or i-type (intrinsic) $Ga_{1-z2}Al_{z2}N$ optical waveguide layer 93 (z1>z2>0), a $Ga_{1-z4}Al_{z4}N$ (doped with Si)/$In_{x0}Ga_{1-x0}N$ multiple-quantum-well active layer 94 (z4>0, x0≧0), a p-type $Ga_{1-z3}Al_{z3}N$ carrier confinement layer 95 (0.35>z3>z2), a p-type or i-type $Ga_{1-z2}Al_{z2}N$ optical waveguide layer 96, a p-type $Ga_{1-z1}Al_{z1}N$/GaN superlattice cladding layer 97 (0<z1<1), and a p-type GaN contact layer 98 are formed on the n-type GaN (0001) substrate 91 by organometallic vapor phase epitaxy. Thereafter, a $SiO_2$ insulation film 99 is formed over the p-type GaN contact layer 98, and a stripe area of the $SiO_2$ insulation film 99 having a width of about 100 μm is removed by normal lithography. Then, a p electrode 100 is formed over the layered structure formed as above. In addition, the rear surface of the substrate 91 is polished, and an n electrode 101 is formed on the polished surface of the substrate 91. Finally, a resonator is formed by cleavage, a high reflectance coating and a low reflectance coating are provided on the respective end surfaces so as to form a resonator, and the construction of FIG. 6 is formed into a chip.

Figure 7A:
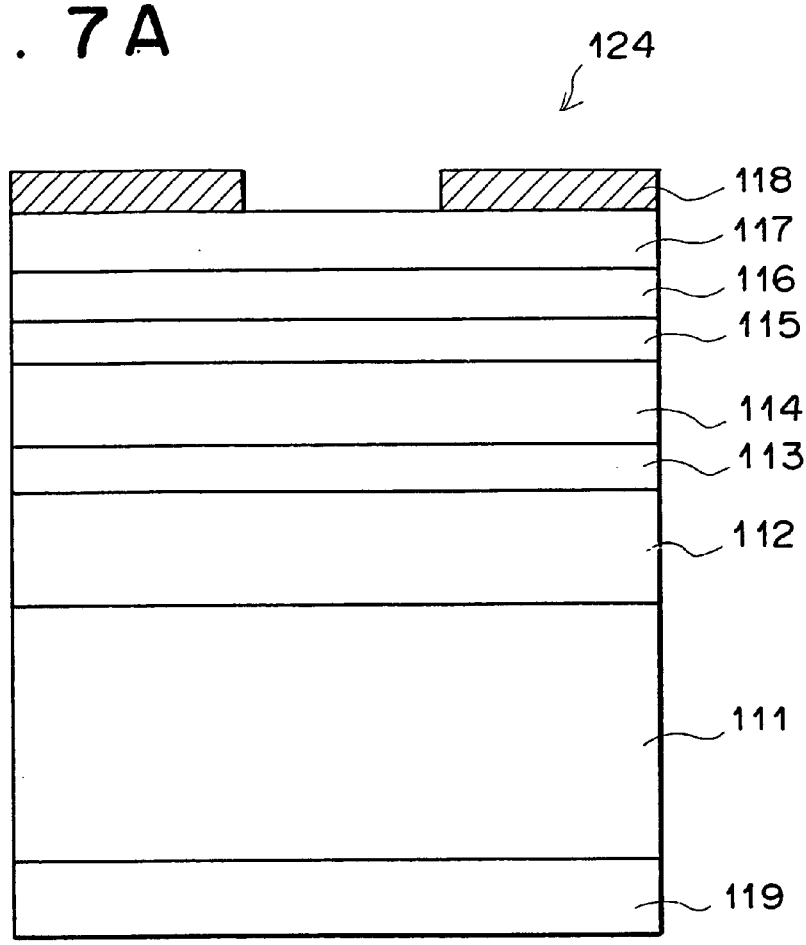
FIG. 7A is a crosssectional view of a surface-emitting semiconductor element which is also used in the laser apparatus as the third embodiment of the present invention.
Figure 7B:
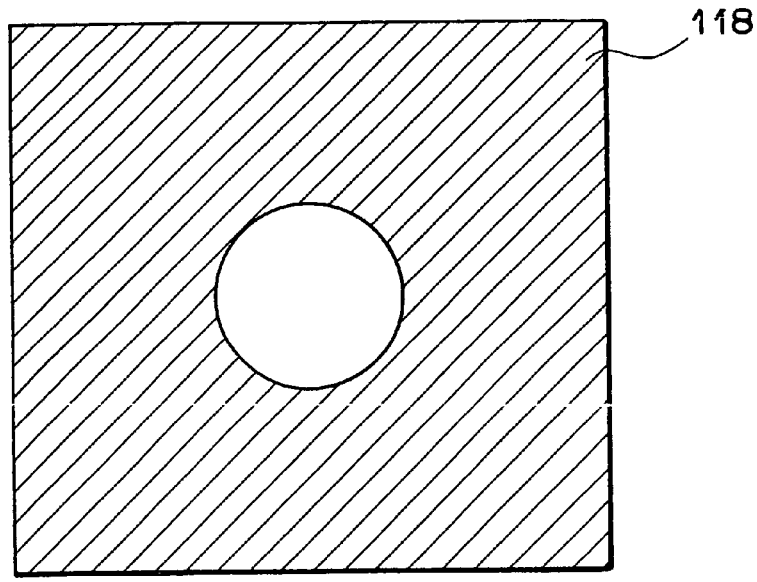
FIG. 7B is a top view of a surface-emitting semiconductor element which is also used in the laser apparatus as the third embodiment of the present invention.

FIGS. 7A and 7B are a crosssectional and top views of a surface-emitting semiconductor element which is also used in the laser apparatus as the third embodiment of the present invention. The surface-emitting semiconductor element illustrated in FIGS. 7A and 7B is excited with excitation laser light emitted from the semiconductor laser element 104 of FIG. 6, and oscillates in a single transverse mode. The surface-emitting semiconductor element used in the third embodiment is produced as follows.

Initially, a Bragg reflection film 112, a GaN optical confinement layer 113, an $In_{x2}Ga_{1-x2}N/In_{x3}Ga_{1-x3}N$ multiple-quantum-well active layer 114 (0<x2<x3<0.5), a GaN optical confinement layer 115, and an $Al_{x4}Ga_{1-x4}N$ carrier confinement layer 116 (x4>0) are formed on a GaN (0001) substrate 111 by organometallic vapor phase epitaxy, where the Bragg reflection film 112 is comprised of 20 pairs of GaN and AlN layers, the GaN layer in each pair has a thickness of $\lambda/4n_{GaN}$, the AlN layer in each pair has a thickness of $\lambda/4n_{AlN}$, λ is an oscillation wavelength of the surface-emitting semiconductor element of FIGS. 7A and 7B, and $n_{GaN}$ and $n_{AlN}$ are the refractive indexes of GaN and AlN at the oscillation wavelength λ, respectively. Next, a $ZrO_2$ antireflection film 117 having a thickness of $\lambda/4n_{ZrO2}$ is formed over the $Al_{x4}Ga_{1-x4}N$ carrier confinement layer 116, by electron beam evaporation or the like, where $n_{ZrO2}$ is the refractive index of $ZrO_2$ at the oscillation wavelength λ. Then, a Ti film 118 having a pinhole at its center is formed on the $ZrO_2$ antireflection film 117 as illustrated in FIG. 7B by a similar process to the first embodiment. Thereafter, the rear surface of the GaAs substrate 111 is polished, and another $ZrO_2$ film 119 is formed on the polished surface of the GaAs substrate 111, where the $ZrO_2$ film 119 functions as an antireflection film at the wavelength (370 nm) of the excitation laser light. Finally, the layered structure formed as above is cleaved, and is further formed into a chip.

Figure 8:
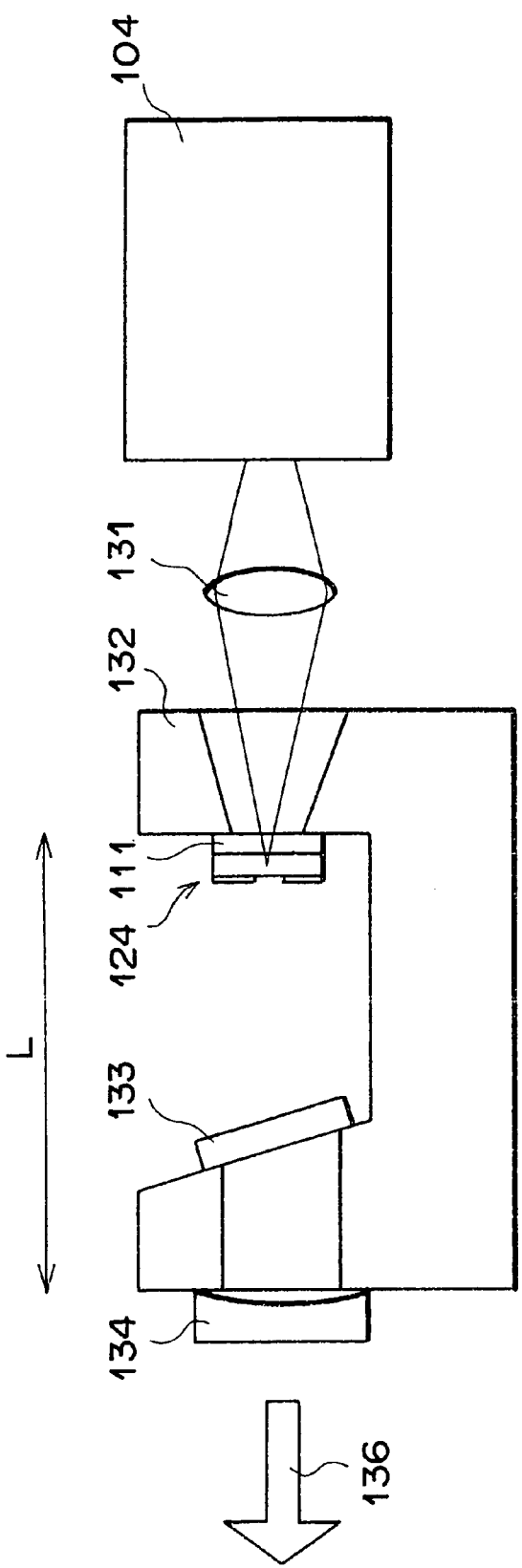
FIG. 8 is a diagram illustrating the construction of the laser apparatus as the third embodiment of the present invention.

FIG. 8 is a diagram illustrating the construction of the laser apparatus as the third embodiment of the present invention.

The laser apparatus of FIG. 8 comprises the semiconductor laser element 104 as the excitation light source, a heatsink 132 having openings, the surface-emitting semiconductor element 124 bonded to the heatsink 132 at the surface of the substrate 111, a concave mirror 134 as an output mirror, an external resonator 137 formed by a concave surface of the concave mirror 134 and the Bragg reflection film 112 of the surface-emitting semiconductor element 124, and a wavelength selection element 133 arranged in the external resonator 137.

In the construction of FIG. 8, excitation laser light emitted from the semiconductor laser element 104 is collected by the lens 131 into the semiconductor layers of the surface-emitting semiconductor element 124, and excites the surface-emitting semiconductor element 124. Then, light emitted by the surface-emitting semiconductor element 124 resonates in the external resonator(length of resonator: L). Thus, laser light 136 in the wavelength range of 400 to 550 nm can be obtained through the output mirror 134.

Since the GaN substrate 111 is transparent to the excitation laser light, it is possible to excite the surface-emitting semiconductor element 119 through the GaN substrate 111. Alternatively, when a sapphire substrate, instead of the GaN substrate, is used in the surface-emitting semiconductor element, the excitation laser light can also be supplied to the surface-emitting semiconductor element through the sapphire substrate since the sapphire substrate is also transparent to the excitation laser light.

In addition, since the thermal conductivities of GaN and sapphire are great, heat generated by the surface-emitting semiconductor element can be easily dissipated when the heatsink 132 is arranged as illustrated in FIG. 8.

Further, beam deformation due to the thermal lens effect is very small.

Alternatively, the surface-emitting semiconductor element may have an InGaAs quantum well active layer formed on a GaAs substrate so as to emit laser light in the wavelength range of about 900 to 1,200 nm, or an InGaAsP or InGaAlAs quantum well active layer formed on an InP substrate so as to emit laser light in the wavelength range of about 1,300 to 1,700 nm. Since the GaAs and InP are transparent to oscillation wavelengths, it is possible to excite such a surface-emitting semiconductor element from the substrate side, when an excitation light source emits laser light to which the above substrates are transparent, and the active layers per se and optical confinement layers or barrier layers surrounding the active layer of the surface-emitting semiconductor element have such compositions and structure that the excitation laser light is efficiently absorbed by the active layer.

Fourth Embodiment

Figure 9A:
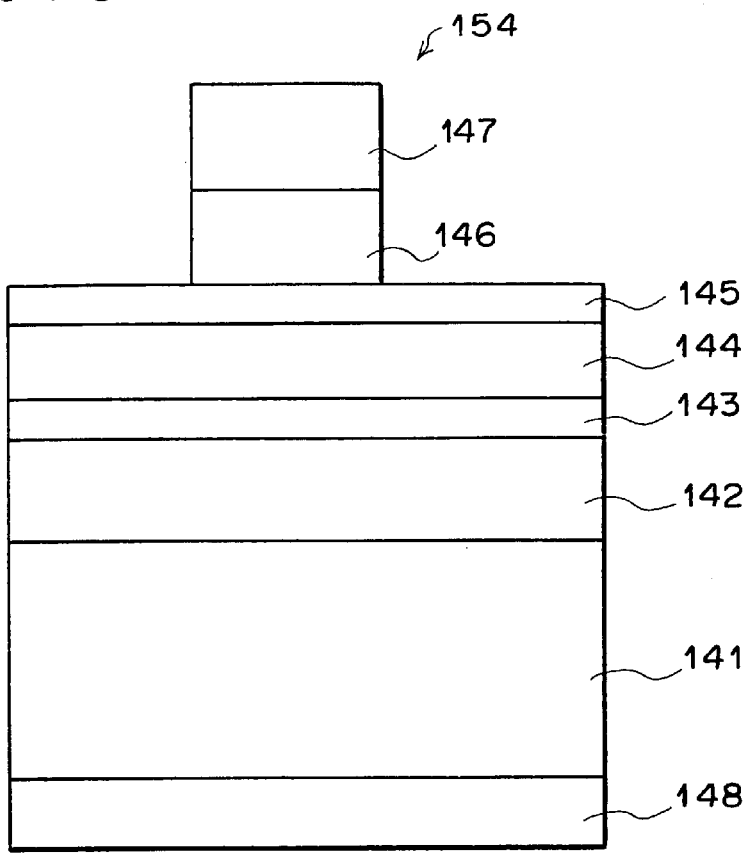
FIG. 9A is a crosssectional view of a surface-emitting semiconductor element which is used in the laser apparatus as the fourth embodiment of the present invention.
Figure 9B:
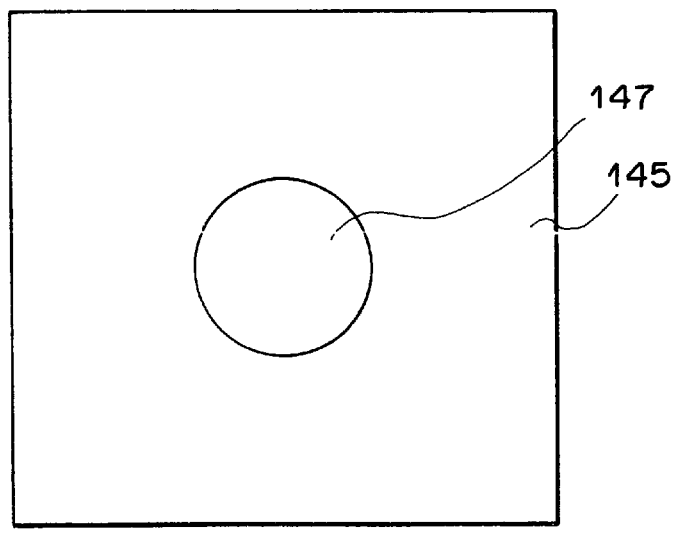
FIG. 9B is a top view of a surface-emitting semiconductor element which is used in the laser apparatus as the fourth embodiment of the present invention.

FIGS. 9A and 9B are a crosssectional and top views of a surface-emitting semiconductor element which is used in the laser apparatus as the fourth embodiment of the present invention. The surface-emitting semiconductor element illustrated in FIGS. 9A and 9B is excited with excitation laser light emitted from the semiconductor laser element 104 of FIG. 6. The surface-emitting semiconductor element used in the fourth embodiment is produced as follows.

Initially, an $Al_{z4}Ga_{1-z4}N$ carrier confinement layer 142 (0<z4<1), a GaN optical confinement layer 143, an $In_{x2}Ga_{1-x2}N/In_{x3}Ga_{1-x3}N$ multiple-quantum-well active layer 144 (0<x2<x3<0.5), a GaN optical confinement layer 145, a semiconductor multilayer 146, and a dielectric multilayer 147 are formed on a GaN substrate 141, where the semiconductor multilayer 146 is comprised of twenty pairs of AlN and GaN layers, and the dielectric multilayer 147 is comprised of twelve pairs of $SiO_2$ and $ZrO_2$ layers. The AlN layer in each pair of semiconductor multilayers 146 has a thickness of $\lambda/4n_{AlN}$, the GaN layer in each pair of semiconductor multilayers 146 has a thickness of $\lambda/4n_{GaN}$, the $SiO_2$ layer in each pair of dielectric multilayers 147 has a thickness of $\lambda/4n_{SiO2}$, and the $ZrO_2$ layer in each pair of dielectric multilayers 147 has a thickness of $\lambda/4n_{ZrO2}$, where λ is an oscillation wavelength of the surface-emitting semiconductor element of FIGS. 9A and 9B, and $n_{AlN}$, $n_{GaN}$, $n_{SiO2}$, and $n_{ZrO2}$ are the refractive indexes of AlN, GaN, $SiO_2$, and $ZrO_2$ at the oscillation wavelength λ, respectively. The semiconductor multilayer 146 and the dielectric multilayer 147 realize a Bragg reflection mirror.

Next, the semiconductor multilayer 146 and the dielectric multilayer 147 are dry-etched so as to have a round shape as illustrated in FIGS. 9A and 9B. Thus, the Bragg reflection mirror has a round shape. Thereafter, the rear surface of the GaAs substrate 141 is polished, and an antireflection film 148 which is transparent to laser light having the oscillation wavelength λ is formed on the polished surface of the GaAs substrate 141. Finally, the layered structure formed as above is cleaved, and is further formed into a chip.

Figure 10:
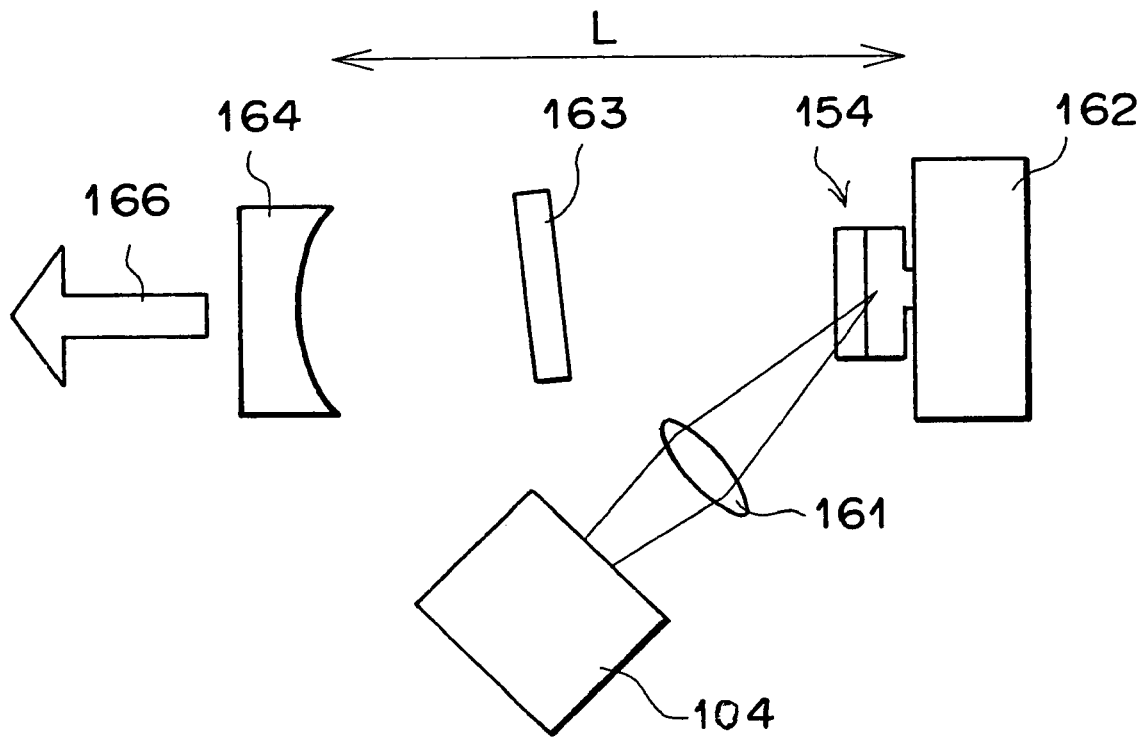
FIG. 10 is a diagram illustrating the construction of the laser apparatus as the fourth embodiment of the present invention.

FIG. 10 is a diagram illustrating the construction of the laser apparatus as the fourth embodiment of the present invention.

The laser apparatus of FIG. 10 comprises the semiconductor laser element 104 as the excitation light source, a heatsink 162, the surface-emitting semiconductor element 154 bonded to the heatsink 162 at the surface of the Bragg reflection mirror, a concave mirror 164 as an output mirror, an external resonator 167 formed by a concave surface of the concave mirror 164 and the Bragg reflection mirror of the surface-emitting semiconductor element 154, and a wavelength selection element 163 arranged in the external resonator 167.

In the laser apparatus of FIG. 10, the excitation laser light emitted from the semiconductor laser element 104 is collected by the lens 161 into the semiconductor layers of the surface-emitting semiconductor element 154, and excites the surface-emitting semiconductor element 154. Then, light emitted by the surface-emitting semiconductor element 154 resonates in the external resonator(length of resonator: L). Thus, laser light 166 in the wavelength range of 400 to 550 nm can be obtained through the output mirror 164.

Since the above Bragg reflection mirror constituted by the semiconductor multilayer 146 and the dielectric multilayer 147 selectively has a high reflectance at the wavelength corresponding to a fundamental transverse mode, and is formed only in the limited (round) area, the spatial mode of the laser oscillation in the laser apparatus of FIG. 10 is controlled by the arrangement of the Bragg reflection mirror.

Fifth Embodiment

Figure 11:
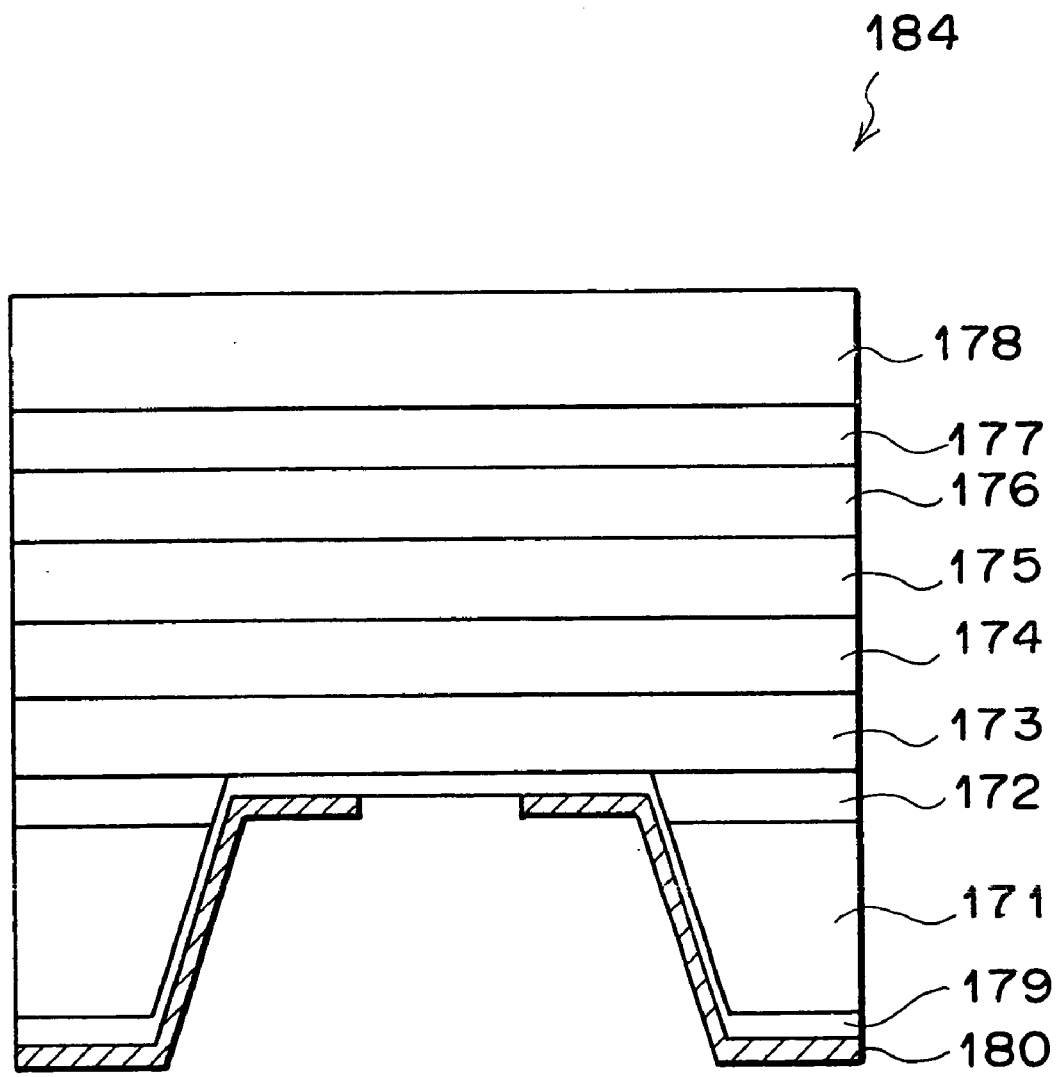
FIG. 11 is a crosssectional view of a surface-emitting semiconductor element which is used in the laser apparatus as the fifth embodiment of the present invention.

FIGS. 11A and 11B are a crosssectional and top views of a surface-emitting semiconductor element which is used in the laser apparatus as the fifth embodiment of the present invention. The surface-emitting semiconductor element used in the fifth embodiment is produced as follows.

Initially, a GaAs buffer layer 172, an $In_{0.5}(Ga_{1-x5}Al_{x5})_{0.5}P$ carrier confinement layer 173, an $In_{0.5}(Ga_{1-x2}Al_{x2})_{0.5}P$ optical confinement layer 174, an $In_{0.5}(Ga_{1-x3}Al_{x3})_{0.5}P/In_{0.5}(Ga_{1-x4}Al_{x4})_{0.5}P$ multiple-quantum-well active layer 175, an $In_{0.5}(Ga_{1-x2}Al_{x2})_{0.5}P$ optical confinement layer 176, and an $In_{0.5}(Ga_{1-x5}Al_{x5})_{0.5}P$ carrier confinement layer 177 are formed on a GaAs (001) substrate 171, where it is preferable that $0 \leq x3 < x4 \leq x2 < x5 \leq 1$, and $x3 < x1 < 1$. Thereafter, a $SiO_2/TiO_2$ multilayer optical filter 178 is formed on the $In_{0.5}(Ga_{1-x5}Al_{x5})_{0.5}P$ carrier confinement layer 177 by electron beam evaporation.

Next, the substrate 171 is polished, and regions of the GaAs substrate 171 and the GaAs buffer layer 172 which are broader than an emission region of the surface-emitting semiconductor element are removed by etching using a sulfuric acid etchant so that a hollow facilitating passage for oscillation laser light (i.e., laser light which oscillates in the external resonator 197) is formed. Next, an antireflection film 179 which is transparent to the oscillation laser light is formed so as to cover the inner surface of the hollow. Finally, a Ti film 180 having a pinhole is formed on the antireflection film 179, where the pinhole is provided for controlling the spatial mode. Thus, a surface-emitting semiconductor element 184 is completed. The surface-emitting semiconductor element 184 is a red surface-emitting semiconductor element which emits laser light in the 650 nm band.

Figure 12:
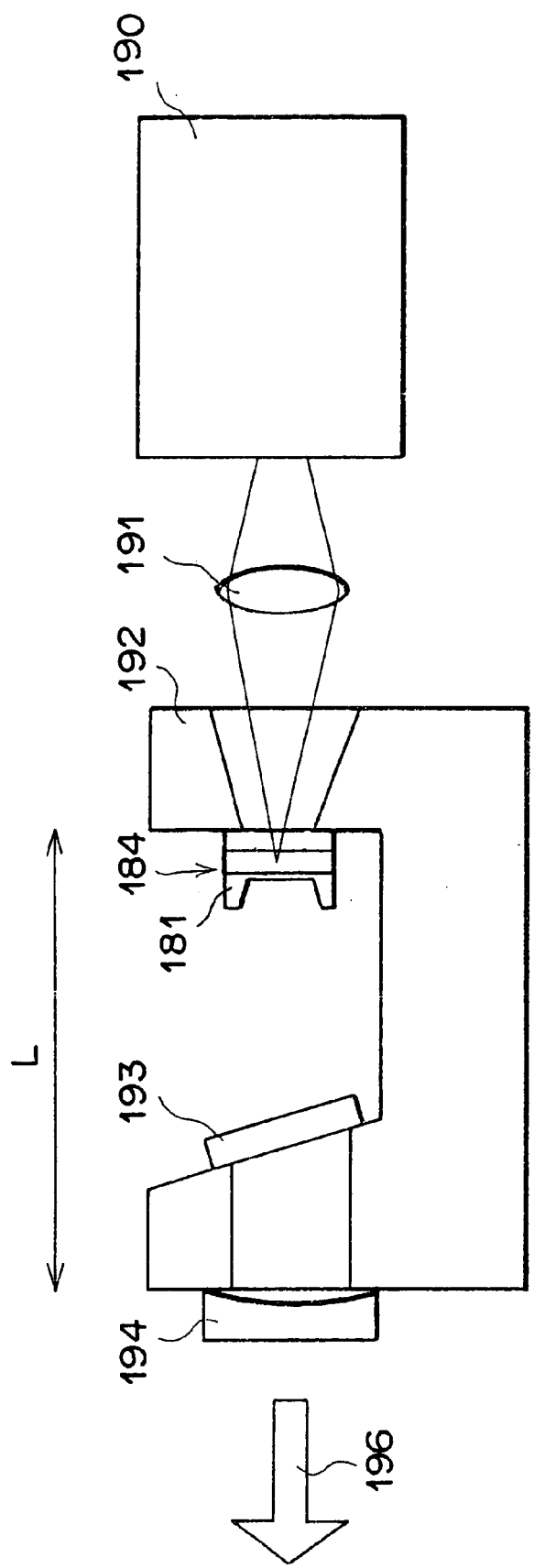
FIG. 12 is a diagram illustrating the construction of the laser apparatus as the fifth embodiment of the present invention.

FIG. 12 is a diagram illustrating the construction of the laser apparatus as the fifth embodiment of the present invention.

The laser apparatus of FIG. 12 comprises a semiconductor laser element 190 as the excitation light source, a heatsink 192 having openings, the surface-emitting semiconductor element 184 bonded to the heatsink 192 at the surface of the $SiO_2/TiO_2$ multilayer optical filter 178, a concave mirror 194 as an output mirror, an external resonator 197 formed by a concave surface of the concave mirror 194 and the $SiO_2/TiO_2$ multilayer optical filter 178 of the surface-emitting semiconductor element 184, and a polarization control element 193 arranged in the external resonator 197.

A wide stripe semiconductor laser element having an InGaN active layer and emitting excitation laser light can be used as the semiconductor laser element 190, and the wavelength of the excitation laser light is, for example, 400 nm. The excitation laser light emitted from the semiconductor laser element 190 is collected by the lens 191 into the semiconductor layers of the surface-emitting semiconductor element 184, and excites the surface-emitting semiconductor element 184. Then, light emitted by the surface-emitting semiconductor element 184 resonates in the external resonator 197. Thus, laser light 196 in the 650 nm band can be obtained through the output mirror 194. In addition, polarization of the laser light 196 is controlled by the polarization control element 193 arranged in the external resonator 197.

In the surface-emitting semiconductor element 184, the $SiO_2/TiO_2$ multilayer optical filter 178 has a high reflectance of 90% or more at the wavelength of the laser light 196, and a reflectance of 5% or less, preferably 1% or less, at the wavelength of the excitation laser light.

Since the GaAs substrate 181 absorbs the laser light 196, it is possible to control the oscillation mode by thinning the GaAs substrate with high accuracy by etching or the like, and arranging a pinhole in the GaAs substrate or the GaAs buffer layer.

Additional Matters (i) The semiconductor laser elements for emitting excitation laser light in the present invention are not limited to the broad-area type semiconductor laser elements, and may be array type semiconductor laser elements, a-DFB (angled grating-distributed feedback) semiconductor lasers, MOPA (master oscillator power amplifier) semiconductor lasers, or the other usual semiconductor lasers. In particular, the MOPA semiconductor lasers, which have a tapered structure, enable high-density light collection.

(ii) Although the antireflection films formed on the surface-emitting semiconductor elements of FIGS. 2A, 4, 7A, 9A, and 11 are single-layer dielectric films, low reflectances may be obtained by multilayer structures.

(iii) When a film being transparent to the oscillation light and having a certain reflectance for the excitation laser light is arranged on the exit side of the oscillation light of a surface-emitting semiconductor element, and the excitation laser light is supplied to the surface-emitting semiconductor element from the backward side (opposite to the exit side of oscillation light), the surface-emitting semiconductor element can be excited with not only a directly absorbed portion of the excitation laser light, but also a portion reflected by the film. Therefore, when the absorption coefficient of the surface-emitting semiconductor element for the excitation laser light is small, the surface-emitting semiconductor element can be efficiently excited with the excitation laser light by arranging the above film on the exit side of the oscillation light.

(iv) In addition, all of the contents of Japanese Patent Application Nos. 11(1999)-257531 and 2000-258857 are incorporated into this specification by reference.

What is claimed is:

1. A laser apparatus comprising:
a semiconductor laser element which emits first laser light having a first wavelength;
a surface-emitting semiconductor element which is excited with said first laser light, emits second laser light having a second wavelength which is longer than said first wavelength, and has a first active layer and a first mirror arranged on one side of said first active layer; and
a second mirror arranged outside said surface-emitting semiconductor element so that said first and second mirrors form a resonator in which said second laser light resonates;
said surface-emitting semiconductor element comprising a structure for controlling a spatial mode of said second laser light, wherein the structure is disposed opposite to a layered arrangement including the active layer.

2. A laser apparatus according to claim 1, wherein said structure has a size which is 0.1 to 10 times as large as a diameter to which said second laser light spreads at a position of said structure, wherein said diameter corresponds to a beam intensity corresponding to $1/e^2$ or more of a peak intensity of the second laser light.

3. A laser apparatus according to claim 1, wherein said structure is realized by a pinhole spatial filter being arranged at a light exit end surface of said surface-emitting semiconductor element, having a pinhole, and allowing passage of said second laser light emitted by the surface-emitting semiconductor element, through only the pinhole.

4. A laser apparatus according to claim 3, wherein said pinhole has a size which is 0.1 to 10 times as large as a diameter to which said second laser light spreads at a position of said structure, wherein said diameter corresponds to a beam intensity corresponding to $1/e^2$ or more of a peak intensity of the second laser light.

5. A laser apparatus according to claim 1, wherein said first mirror has a limited area, is arranged in parallel with a light exit end surface of said surface-emitting semiconductor element, and realizes said structure.

6. A laser apparatus according to claim 5, wherein said first mirror has a size which is 0.1 to 10 times as large as a diameter to which said second laser light spreads at a position of said structure, wherein said diameter corresponds to a beam intensity corresponding to $1/e^2$ or more of a peak intensity of the second laser light.

7. A laser apparatus according to claim 1, wherein said first active layer is formed in only a limited area in a plane parallel to a light exit end surface of said surface-emitting semiconductor element, and realizes said structure.

8. A laser apparatus according to claim 7, wherein said limited area has a size which is 0.1 to 10 times as large as a diameter to which said second laser light spreads at a position of said structure, wherein said diameter corresponds to a beam intensity corresponding to $1/e^2$ or more of a peak intensity of the second laser light.

9. A laser apparatus according to claim 1, further comprising wavelength selection means arranged in said resonator.

10. A laser apparatus according to claim 1, further comprising polarization control means arranged in said resonator.

11. A laser apparatus according to claim 1, wherein said semiconductor laser element has a second active layer made of an $In_{v1}Ga_{1-v1}N$ material, and said first active layer is made of an $In_{v2}Ga_{1-v2}N$ material, where $0<v1<v2<1$.

12. A laser apparatus according to claim 1, wherein said semiconductor laser element has a second active layer made of an InGaN material, and said first active layer is made of an AlGaInP or GaInP material.

13. A laser apparatus according to claim 1, wherein said semiconductor laser element has a second active layer made of an $In_{w1}Ga_{1-w1}As$ material, and said first active layer is made of an $In_{w2}Ga_{1-w2}As$ material, where $0<w1<w2<1$.

14. A laser apparatus comprising:
a semiconductor laser element which emits first light having a first wavelength;
a surface-emitting semiconductor element which is excited by the first laser light, emits second laser light having a second wavelength which is longer than said first wavelength, and has a first active layer and a first mirror arranged on one side of said first active layer; and
a second mirror arranged outside said surface-emitting semiconductor element and emitting the second laser light having the second wavelength as a primary laser output, and further resonating said second laser light having the second wavelength in conjunction with said first mirror, said surface-emitting semiconductor element comprising a structure for controlling a spatial mode of said second laser light, wherein the structure is disposed opposite to a layered arrangement having the active layer.

15. The laser apparatus according to claim 14, wherein said surface-emitting semiconductor element comprises a light confining structure for controlling a fundamental mode of said second laser light.

16. The laser apparatus of claim 15, wherein said structure has a size which is 0.1 to 10 times as large as a diameter to which said second laser light spreads at a position of said structure, wherein said diameter corresponds to a beam intensity corresponding to $1/e^2$ or more of a peak intensity of the second laser light.

17. The laser apparatus of claim 15, wherein said structure is realized by a pinhole spatial filter being arranged at a light exit end surface of said surface-emitting semiconductor element, having a pinhole, and allowing passage of said second laser light emitted by the surface-emitting semiconductor element, through only the pinhole.

18. The laser apparatus of claim 17, wherein said pinhole has a size which is 0.1 to 10 times as large as a diameter to which said second laser light spreads at a position of said structure, wherein said diameter corresponds to a beam intensity corresponding to $1/e^2$ or more of a peak intensity of the second laser light.

19. The laser apparatus of claim 15, wherein said first mirror has a limited area, is arranged in parallel with a light exit end surface of said surface-emitting semiconductor element, and realizes said structure.

20. The laser apparatus of claim 19, wherein said first mirror has a size which is 0.1 to 10 times as large as a diameter to which said second laser light spreads at a position of said structure, wherein said diameter corresponds to a beam intensity corresponding to $1/e^2$ or more of a peak intensity of the second laser light.

21. The laser apparatus of claim 1, wherein said structure controls second laser light to a fundamental mode of oscillation by confining light.

22. The laser apparatus according to one of claims 2, 4, 6, 8, 16, 18 or 20 wherein said diameter is approximately 0.3 mm.

23. The laser apparatus according to claim 1, wherein the surface emitting element including said structure is attached to a heat sink.

24. The laser apparatus according to claim 15, wherein the surface emitting element including said light confining structure is attached to a heat sink.

* * * * *